United States Patent [19]

Pavelchek et al.

[11] Patent Number: 5,366,852
[45] Date of Patent: Nov. 22, 1994

[54] METHODS FOR TREATING PHOTORESISTS

[75] Inventors: Edward K. Pavelchek, Waltham, Mass.; Peter W. Freeman, Austin, Tex.; John F. Bohland, Berlin, Mass.; Susan K. Jones, Raleigh; Bruce W. Dudley, Durham, both of N.C.

[73] Assignees: Shipley Company, Inc., Marlborough; Digital Equipment Corporation, Maynard, both of Mass.

[21] Appl. No.: 948,022

[22] Filed: Sep. 21, 1992

[51] Int. Cl.$^5$ .................... G03F 7/30; G03F 7/36; G03F 7/40

[52] U.S. Cl. ..................... 430/326; 430/313; 430/315; 430/323; 430/324; 430/325; 430/329; 156/628; 156/643

[58] Field of Search ............... 430/324, 323, 313, 315, 430/325, 326, 329; 156/628, 643

[56] References Cited

U.S. PATENT DOCUMENTS

| | | | |
|---|---|---|---|
| 4,357,369 | 11/1982 | Kilichowski et al. | 427/90 |
| 4,396,704 | 8/1983 | Taylor | 430/311 |
| 4,426,247 | 1/1984 | Tamamura et al. | 156/643 |
| 4,430,153 | 2/1984 | Gleason et al. | 156/643 |
| 4,433,044 | 2/1984 | Meyer et al. | 430/271 |
| 4,552,833 | 11/1985 | Ito et al. | 430/325 |
| 4,921,778 | 5/1990 | Thackeray et al. | 430/326 |
| 4,931,351 | 6/1990 | McColgin et al. | 430/323 |
| 5,079,131 | 1/1992 | Thackeray et al. | 430/326 |
| 5,108,875 | 4/1992 | Thackeray et al. | 430/326 |
| 5,250,375 | 10/1993 | Sebald et al | 430/323 |

FOREIGN PATENT DOCUMENTS 1-94622  4/1989  Japan ................... 430/326

OTHER PUBLICATIONS

Patent-Trademark Office English-Language Translation of Japanese Patent 1-94622 (Apr. 13, 1989).

*Primary Examiner*—Janis Dote
*Attorney, Agent, or Firm*—Robert L. Goldberg; Peter F. Corless

[57] ABSTRACT

The present invention comprises methods for treating photoresists and forming photoresist relief images, including a method comprising providing a photoresist coating having a crosslinked surface layer, treating the photoresist coating with an organometallic material, and developing the photoresist coating to provide a relief image comprising an etch resistant effective amount of organometallic material.

3 Claims, 3 Drawing Sheets

METHODS FOR TREATING PHOTORESISTS

BACKGROUND OF THE INVENTION

1. Field of the Invention

The present invention provides methods for treating photoresist including methods of forming photoresist relief images having micron and submicron dimensions. More particularly, in one aspect, methods are provided that comprise treating a photoresist coating having a crosslinked surface layer with an organometallic treatment to provide high resolution relief images exhibiting enhanced resistance to plasma etchants.

2. Background Art

Photoresists are photosensitive films used for transfer of an image to a substrate. They may be negative or positive acting. After a coating layer of a photoresist is formed on a substrate, the coating is selectively exposed through a photomask to a source of activating energy such as ultraviolet light. The photomask has areas that are opaque to activating radiation and other areas that are transparent to activating radiation. A relief image is provided upon development of the latent image patterned in the resist coating. The background and use of photoresists are generally described, for example, in Deforest, *Photoresist Materials and Processes*, McGraw Hill Book Company, New York (1975), and Moreau, *Semiconductor Lithography, Principles, Practices and Materials*, Plenum Press, New York (1988).

A number of advancements in electronic devices and components have resulted from improvements in manufacturing techniques. Specifically, improvements have occurred in microlithography and in methods of transferring the patterns used to create the complex structures within the electronic devices.

An often preferred method of transferring patterns of micron and submicron dimensions to a substrate is dry etching. The method utilizes plasma or reactive ion etching to remove specific areas of material on a surface so that a pattern remains. Typically the material to be dry etched to create a pattern is a polymeric material for reasons of ease of use, material properties and cost considerations. When an organic polymer is used, dry etching can be done using an oxygen plasma or oxygen reactive ion etching.

During oxygen plasma and/or oxygen reactive ion etching, the organic content of a polymer is converted to a gaseous form which is easily removed. To create the desired pattern, methods have been reported where polymeric material is made resistant to the etching material. See, generally, U.S. Pat. Nos. 4,357,369; 4,396,704; 4,426,247; 4,430,153; 4,433,044; 4,552,833; 4,613,398; 4,921,778; 5,079,131; and 5,108,875.

In U.S. Pat. No. 5,079,131 to Thackeray, et al., a process is disclosed for the formation of positive-tone relief images. The patent discloses, inter alia, subjecting an exposed acid hardening photoresist to treatment with an organometallic material such as a silyl reagent followed by dry development (e.g., oxygen plasma etch) of exposed regions. The organometallic reagent selectively reacts only with unexposed areas of the coating layer and not in exposed or crosslinked areas of the photoresist.

The present invention represents further advances in the art.

SUMMARY OF INVENTION

In one aspect, methods are provided comprising multiple separate treatments (in particular, two separate treatments) of a photoresist coating, followed by development of the treated resist coating. The first treatment results in formation of a crosslinked surface layer or skin on a resist coating, e.g., by treating a resist coating with a crosslinking agent. A subsequent treatment comprises application of an organometallic material that diffuses into the resist coating to impart etch resistance. A preferred photoresist is an acid hardening resist that undergoes acid catalyzed crosslinking in regions exposed to activating radiation, although other resists can be employed including base-hardening resists.

It has been found that incorporation of organometallic materials into photoresist films can lower the glass transition temperature ($T_g$) of the resist film. In particular, it is believed that incorporation of metals such as silyl groups into a resist film results in a lower $T_g$ as a result of disrupting intramolecular and/or intermolecular hydrogen bonding of the resist components. It has been further found that for many photoresist formulations, the decreased $T_g$ of the resist that occurs upon organometallic incorporation can be less than the temperature of the vapor phase organometallo-incorporation reaction. Hence, undesirable flow of the resist coating layer can occur during such a vapor phase reaction, compromising resolution of the image patterned in the resist coating.

It now has been discovered that by first forming a crosslinked surface layer on a photoresist coating prior to such a vapor phase organometallo-incorporation reaction, the described problem of thermal flow or other swelling of the photoresist is largely, if not completely obviated. The crosslinked surface is believed to preclude or at least significantly inhibit lateral flow of resist during vapor phase treatment. Moreover, it has been found that such a crosslinked layer does not significantly reduce penetration of the subsequently applied organometallic material. That is, an effective plasma etch resistant layer of organometallic material can be readily incorporated into the resist layer.

Further provided are novel articles of manufacture including an article comprising a photoresist relief image with crosslinked surface layer and organometallic material, including where at least a portion, substantially or even essentially all of the organometallic material is positioned beneath the crosslinked surface layer.

In another aspect, methods are provided comprising partially developing a photoresist coating followed by application of an organometallic material. A preferred photoresist for such methods is an acid-hardening photoresist, although other resists also can be employed including base-hardening photoresists.

It has been found that incorporation of organometallic materials into photoresist films can result in expansion or swelling of areas of incorporation of the material and lateral flow of those areas into adjacent coating layer regions, thereby compromising resolution of a patterned image.

It now has been discovered that by partially developing a photoresist coating prior to organometallic treatment to remove a volume of resist material that is at least a fraction of the volume of organometallic material subsequently deposited, the described problems of swelling and lateral flow of material is avoided.

Other aspects of the invention are disclosed infra.

As used herein, the term "photoresist" is intended to include any photoimageable composition, although preferred aspects of the invention include use of high resolution photoresists, that is resists that can provide well resolved micron and submicron relief images, e.g., features of about 1.0 μm or less with essentially vertical sidewalls. As used herein, the term "activating radiation" refers to energy of a suitable dose and wavelength to provide a relief image when appropriately applied to a photoresist coating.

DETAILED DESCRIPTION OF THE INVENTION

The present invention comprises new photoresist image fabrication methods that utilize unique surface chemistry techniques.

Figure 1:
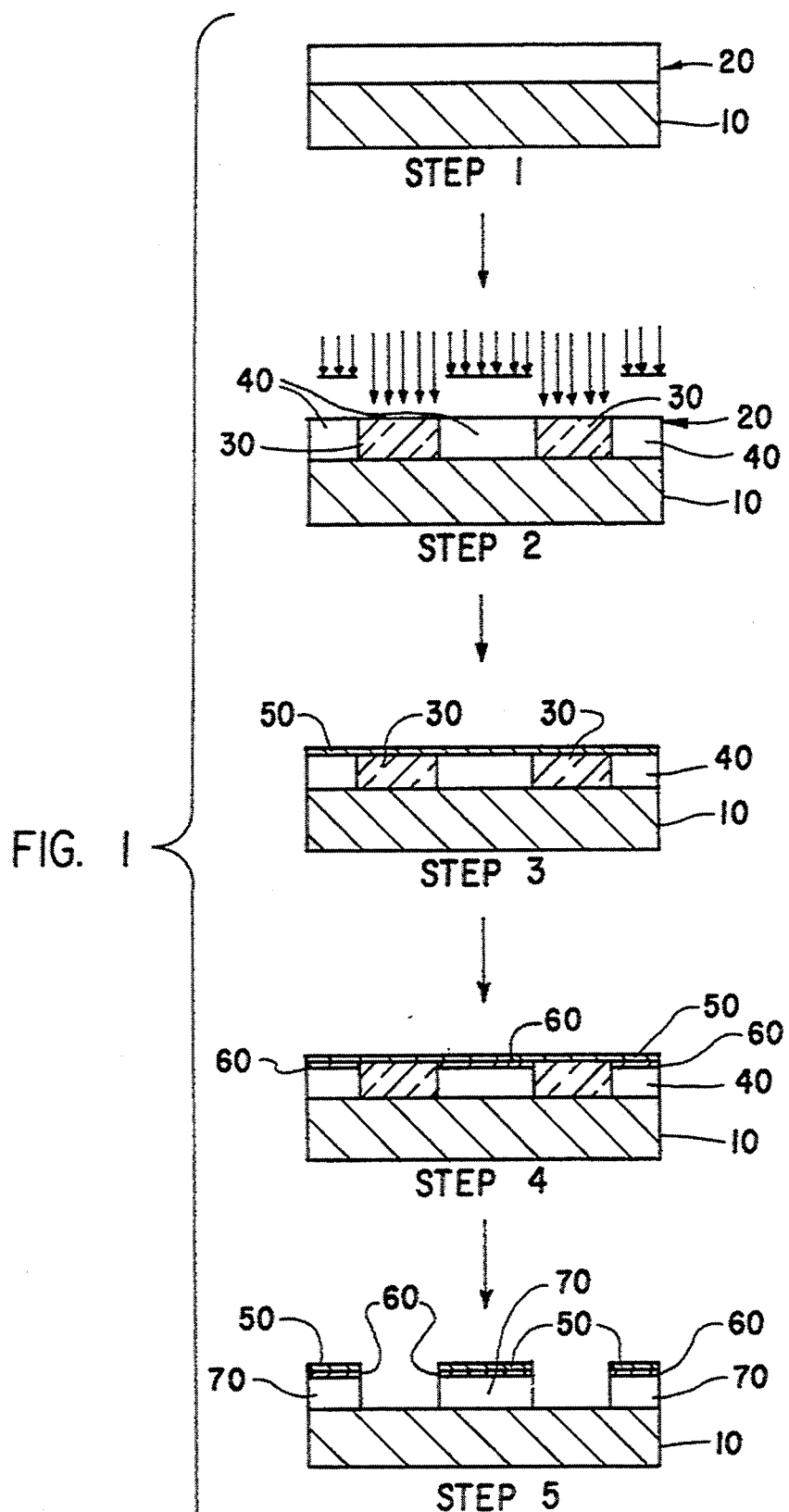
FIG. 1 illustrates schematically a preferred method of the invention.

In FIG. 1 of the drawings one preferred method of the invention is shown, although it should be appreciated that the invention is in no event limited to this depicted method. In Step 1 of FIG. 1, substrate 10 is coated with a photoresist formulation. For manufacture of electronic devices suitable substrates include, e.g., microelectronic wafers composed of materials such as silicon, aluminum or polymeric resins, silicon dioxide, doped silicon dioxide, silicon resins, gallium arsenide, silicon nitride, copper, aluminum-copper mixtures and ceramics. The photoresist can be applied by known methods such as dip coating, spray coating, and spin coating. In the case of spin coating, the solids content of the resist formulation and the spinning speed can be appropriately adjusted to provide a coating layer of desired thickness. The substrate surface optionally may be pretreated with known adhesion promoters such as hexamethyldisilazane. After coating, the liquid resist layer is dried to remove solvent to provide resist coating 20. Exemplary conditions for such solvent removal include heating the coated substrate at a temperature of between about 70° C. to 120° C. for about one minute.

Photoresists suitable for use in the present invention include those that comprise a crosslinking agent, preferably a nonphotoactive crosslinking agent. The crosslinking agent in general will be an additional material in the composition, although the present invention includes use of compositions where the crosslinker component of the photoresist is an integral part of another resist component, e.g., a resin binder that comprises pendant reactive groups that will form crosslinks with other composition components upon treatment with appropriate radiation or other activation.

While use of negative acting photoresists comprising a crosslinking agent is a generally preferred aspect of the present invention, the invention also includes use of photoresists that do not contain a crosslinking agent. For example, phenolic polymers will undergo direct photoinduced crosslinking at short wavelengths (particularly at wavelengths shorter than 248 nm such as 193 nm). See Hartney, M. A., et al., *Microlithography World*, 1: 16 (1992). It also has been found that selective positive tone incorporation of organometallic material, specifically organosilane material, occurs with compositions comprised of only phenolic polymers (no photoactive component or crosslinking agent) in a solvent or solvent mixture. Hence, the present invention will have utility in such compositions including compositions that are free or essentially free of a crosslinking agent, or compositions that are free or essentially free of a crosslinking agent and photoactive component, particularly at short exposure wavelengths such as those mentioned above.

Particularly preferred photoresists for purposes of the invention are acid hardening resists that comprise a resin binder, a crosslinking agent and a photoactive component. Preferred resin binders of such photoresists include phenolic resins such as the novolak resins, homo and copolymers of alkenyl polymers, partially hydrogenated novolak and poly(vinylphenol) resins, and homo and copolymers of N-hydroxyphenyl-maleimides. Preferred resin binders are disclosed in U.S. Pat. No. 5,128,232 to Thackeray, et al., and European Published Patent Applications Nos. 0164248 and 0232972.

Preferred crosslinking agents of the acid hardening photoresists include amine-based materials such a melamine monomer, oligomer or polymer and various resins such as melamine-formaldehyde, benzoguanamine-formaldehyde, urea-formaldehyde and glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Specifically suitable amine-based crosslinkers include melamines manufactured by American Cyanamide Company of Wayne, N.J. such as Cymel$^R$ 300, 301, 303, 350, 370, 380, 116 and 1130; benzoguanamine resins such as Cymel$^R$ 1123 and 1125; glycouril resins Cymel$^R$ 1170, 1171 and 1172; and the urea-based resins Beetle$^R$ 60, 65 and 80.

The photoresist compositions further comprise a photoactive component. The photoactive component will most typically be an additional material in the composition, although the present invention includes use of compositions where the photoactive component is an integral part of another resist component, e.g., a resin binder that comprises pendant photoactive groups or a resin binder that comprises a photoactive group as a unit of the polymer chain. The photoactive component should be present in a photoresist in an amount sufficient to enable development of a coating layer of the resist following exposure of the same to activating radiation.

Suitable photoactive components include acid generators, for example, non-ionic organic compounds such as halogenated non-ionic photoacid generators. Suitable halogenated non-ionic photoacid generators include, e.g., 1,1-bis(p-chlorophenyl)-2,2,2-trichlorethane and tris(2,3-dibromopropyl)isocyanurate with the latter compound being generally preferred. Other suitable halogenated non-ionic photoacid generators are disclosed in U.S. Pat. No. 5,128,232 and European Published Patent Application No. 023972.

Another generally preferred photoacid generator is the onium salts, preferably those with weakly nucleophilic anions. Such anions are the halogen complex anions of divalent metals or nonmetals, for example, Sb, Sn, Fe, Bi, Al, Ga, In, Ti, Zr, Sc, D, Cr, Hf, and Cu as well as B, P and As. Examples of suitable onium salts are diaryldiazonium salts and onium salts of group Va and b, Ia and b and I of the Periodic Table, for example, halonium salts, particularly aromatic iodonium and iodoxonium salts, quaternary ammonium salts, phosphonium and arsonium salts, aromatic sulfonium salts and sulfoxonium salts and selenonium salts. Examples of suitable onium salts can be found in U.S. Pat. Nos. 4,442,197; 4,603,101; 4,624,912 and 5,079131.

Base-hardening photoresists also will be suitable for purposes of the present invention. A base-hardening photoresist comprises a base or a photobase generator compound and one or more materials that will harden or crosslink in the presence of base. A photobase generator compound typically will be a neutral compound that generates base (e.g., an organic base such as an amine) upon photoactivation. Suitable photobase generator compounds have been described in Winkle, et al., *Journal of Photopolymer Science and Technology*, vol. 3, no. 3, 419–422 (1990), and European Patent Application 0425 142 A2, publication date Feb. 5, 1991. Specifically, a suitable photobase-hardening composition will comprise a photobase generator such as one or more of those described in the above mentioned publications, a resin binder such as a poly(vinylphenol) or novolak resin such as those described above in reference to acid-hardening resists, and a base-activated crosslinking agent such as an epoxy compound, e.g., a diglycidyl ether of Bisphenol A (e.g. EPON Resin 828 available from Shell Chemical Co.) or a maleimide such as methylenedianiline bismaleimide. Based on composition components other than solvent (i.e., total solids), the photobase generator compound is suitably used in an amount of from 1 to 15 weight percent of the weight of total solids of the resist, the phenolic resin binder is suitably used in an amount of from 35 to 85 weight percent of the weight of total solids of the resist, and the base-activated crosslinker is suitably used in an amount of from 30 to 40 weight percent of the weight of total solids of the resist.

The photoresist components are typically dissolved in one or more solvents for application to a substrate. Suitable photoresist solvents and solids content of photoresist compositions are known in the art and disclosed in the above mentioned patents and published patent applications.

Photoresists suitable for use in accordance with the invention may also contain other materials such as solvents, actinic and contrast dyes, anti-striation agents, plasticizers, speed enhancers, etc. Such materials are typically added to a photoresist formulation prior to application of same onto a substrate.

Specifically preferred photoresist compositions for use in accordance with the present invention include those acid hardening compositions disclosed in U.S. Pat. No. 5,128,232 and in the above referenced European Published Patent Applications.

In Step 2 of the method shown in FIG. 1, photoresist coating 20 is exposed to patterned activating radiation to form a latent image in the dried coating layer comprising exposed areas 30 and unexposed areas 40. The reagents and methods of the invention afford increased resolution ability in resist pattern fabrication due to the fact that only a portion of the thickness of the resist film needs to be exposed, typically between about 2000 and 6000 Angstroms of the film, depending on factors such as the film thickness. This eliminates at least in part concerns of phenolic absorption in the resist coating.

Exposure is generally carried by known procedures with the proviso that only a portion of the thickness of resist film needs to be exposed. More particularly, for a resist that is photoactivated by radiation in the deep UV range, the resist can be exposed through a phototool to a source of activating radiation having a wavelength of 350 nm or less, preferably 248 nm, using an excimer laser and an exposure dose within a wide range, e.g., from 10 to 500 mJ/cm$^2$ or more. After exposure of an acid hardening photoresist, the imaged resist coating is typically heated to induce or enhance crosslinking in exposed regions 30 of resist coating layer 20. A base-hardening resist can also be post-exposure baked if desired. Exemplary post exposure bake conditions can vary, but are preferably relatively mild, for example baking the coated substrate on a hotplate at between about 90° and 120° C. for about one minute.

In Step 3 of the method depicted in FIG. 1, the exposed photoresist coating is treated to form a crosslinked layer 50 on the top surface of resist coating 20. Layer 50 can be formed by treating the resist coating with a crosslinking agent which forms a crosslinked surface layer in both exposed areas 30 and unexposed areas 40 of the resist coating. Such a crosslinking agent is preferably applied to resist coating layer 20 by vapor phase deposition, although liquid phase applications also can be employed. While the top surface of the unexposed regions are crosslinked as a result of this treatment step, the interior of unexposed areas 40 remain substantially, essentially or completely free of crosslinking.

The crosslinked resist surface layer 50 should not significantly inhibit penetration of the subsequently applied organometallic material. A crosslinked surface layer having a thickness of less than about 200 Angstroms has been found suitable. Other concerns also dictate formation of a rather thin (e.g., about 350 Angstroms or less) crosslinked surface layer. For example, if too thick of a crosslinked surface layer is formed, it is possible the resist coating can crack and thereby reduce resolution of the patterned image. Additionally, too thick of a crosslinked surface layer can interfere with subsequent development of exposed regions 30.

Numerous reagents will be suitable for use to form layer 50 including those reagents that have multiple functionalities that can form crosslinks between resist components, for example crosslinks between hydroxyl groups of a phenolic resin binder. One preferred group of crosslinkers is organometallic reagents, preferably a multifunctional metalating compounds such as bifunctional metalating compounds, i.e., organometallic species having two reactive sites per metal for reaction one or more resist components such as the resin binder. In general, of the organometallic crosslinkers, organosilanes are preferred, although other compounds also will be suitable such as materials comprising Sn, Ti, P, Ge, and Zr, particularly Ti.

A preferred group of organometallic crosslinkers include compounds of the following formula I:

$$(R_1R_2N)_2SiR_3R_4 \qquad \text{I}$$

wherein R₁ through R₄ are each independently selected from the group consisting of substituted and unsubstituted alkyl, preferably alkyl having from 1 to 16 carbon atoms, more preferably having from 1 to about 6 carbon atoms, and still more preferably having from 1 to about 4 carbon atoms. Suitable substituents of said substituted alkyl groups include halogen and alkoxy including alkoxy having one or more oxygen linkages and from 1 to about 8 carbon atoms. Typically R₁ and R₂ are the same and R₃ and R₄ are the same. A specifically preferred crosslinker is bis(dimethylamino)dimethylsilane (i.e., each of substituents of the above formula I being methyl).

Suitable application conditions of a crosslinking agent to form surface layer 50 can be readily determined. For example, suitable vapor phase deposition conditions of an organosilane reagent such as bis(dimethylamino)-dimethylsilane include pressures of from about 10 to 80 torr for between about 10 and 200 seconds and at temperatures of from about 80° to 120° C. Suitable liquid phase applications will include treatment of a resist coating with the crosslinker either neat or dissolved in a solvent carrier at room temperature or elevated temperatures as may be required to effect the desired reaction.

In addition to the above, other crosslinking agents and methods will find utility in forming the crosslinked surface layer 50. For example, other crosslinkers may include hexamethylcyclotrisilazane, octamethylcyclotetrasilazane and 1,3-dichlorodimethyl diphenylsiloxane. See, also, U.S. Pat. No. 4,873,176 to Fisher.

It has been found crosslinked layer 50 does not substantially inhibit penetration of a subsequently applied organometallic material. For example, it was found that a 60 second vapor phase treatment of an acid hardening photoresist coating layer with bis(dimethylamino)dimethylsilane provided an effective crosslinked surface on the unexposed regions of the resist coating with only a 26% volume decline in penetration rate of subsequently applied gaseous dimethylsilyldimethylamine, relative to a comparable photoresist coating that had not been pretreated with a crosslinking agent. The term "effective" crosslinked surface is meant to indicate that substantially or essentially no lateral flow of the coating layer is observed during a subsequent vapor phase application of an organometallic reagent.

In Step 4 of the method depicted in FIG. 1, the photoresist coating with crosslinked surface layer 50 is treated with an organometallic reagent. This treatment should result in the incorporation of an etch resistant effective amount of organometallic material into resist coating layer 20. That is, a sufficient amount of the organometallic material should be incorporated into the resist coating so that the coating layer can withstand subsequent plasma etch treatment.

While both vapor phase and liquid phase applications of the organometallic reagent can be employed in this process step, vapor phase applications are generally preferred. Suitable application conditions can be readily determined on the basis of the particular organometallic reagent employed. For example, suitable vapor phase deposition conditions of an organosilane reagent such as (trimethylsilyl)diethylamine include pressures of from about 10 to 80 torr for between about 30 and 300 seconds and at temperatures of from about 90° to 120° C. Suitable liquid phase application conditions include treatment of a resist coating with the organometallic material either neat or dissolved in a solvent carrier at room temperature or elevated temperatures as may be required to effect the desired reaction. More particularly, (trimethylsilyl)diethylamine can be dissolved at about 10 to 20 weight percent in xylenes and the xylene solution applied to a resist coating at room temperature.

In general, this treatment results in selective incorporation of organometallic material into unexposed areas 40 only and not into exposed areas 30. That is, exposed areas 30 are substantially or even essentially free of organometallic material. Without wishing to be bound by theory, it is believed that the organometallic material is selectively applied into unexposed regions 40 due to the lack of sites available for the organometallic material in the crosslinked (i.e., exposed) areas 30, and/or the inability of the organometallic material to diffuse into crosslinked areas 30.

Numerous organometallic reagents will be suitable for this process step. In general, monofunctional metalating compounds (i.e., organometallic species having one reactive site per metal for reaction with the backbone of the resist resin binder) are preferred, although multifunctional metalating agents also can be employed. Monofunctional metalating agents are generally more preferred because they can diffuse more freely into unexposed regions of a photoresist coating due to their comparatively fewer reactive sites.

One preferred group of metalating agents for this process step are tetra-substituted organometallic compounds, including the compounds of the following formula II:

$$R_5R_6R_7R_8\text{—M} \qquad \text{II}$$

wherein:

M is selected from the group consisting of Si, Sn, Ti, P, Ge and Zr, and is preferably Si, and the substituents R₅ through R₈ are each independently selected from the group consisting of substituted and unsubstituted alkyl, substituted and unsubstituted aryl and a suitable leaving group. The alkyl groups preferably have from 1 to about 16 carbon atoms, more preferably 1 to 10 carbon atoms, still more preferably 1 to about 6 carbon atoms, even more preferably 1 to 3 carbon atoms. Suitable aryl groups include phenyl and napthyl with phenyl being more preferred. Suitable leaving groups include for example halogen such as chloro, bromo or iodo; alkoxy such as alkoxy having from 1 to about 8 carbon atoms, more typically alkoxy having from 1 to about 4 carbon atoms; aryloxy such as phenoxy or substituted phenoxy; and disubstituted amino such as alkyl (e.g., $C_{1\text{-}8}$-alkyl) and/or aryl (e.g., $C_{6\text{-}10}$-aryl) substituted amino. Suitable substituents of said substituted groups including said substituted R₁–R₄ groups comprise, for example, halogen, alkyl such as alkyl having 1 to about 16 carbon atoms, more preferably 1 to about 6 carbon atoms, and heteroalkyl including alkoxy such as alkoxy having one or more oxygen linkages and from 1 to about 10 carbon atoms, more preferably 1 to about 6 carbon atoms.

Another preferred group of organometallic reagents for this process step are amine reagents. Specifically preferred are compounds of the following formula III:

$$(R_9R_{10}R_{11}\text{—M})_{2-x}\text{—NH}_{1-x} \qquad \text{III}$$

wherein,

M is selected from the group consisting of Si, Sn, Ti, P, Ge and Zr, and is preferably Si, X is 0 or 1, and the substituents $R_9$ through $R_{11}$ are each independently selected from the group consisting of substituted and unsubstituted alkyl, substituted and unsubstituted aryl and a suitable leaving group. The alkyl groups preferably have from 1 to about 16 carbon atoms, more preferably 1 to 10 carbon atoms, still more preferably 1 to about 6 carbon atoms, even more preferably 1 to 3 carbon atoms. Suitable aryl groups include phenyl and napthyl with phenyl being more preferred. Suitable leaving groups include for example halogen such as chloro, bromo or iodo; alkoxy such as alkoxy having from 1 to about 8 carbon atoms, more typically alkoxy having from 1 to about 4 carbon atoms; aryloxy such as phenoxy or substituted phenoxy; and disubstituted amino such as alkyl (e.g., $C_{1-8}$-alkyl) or aryl (e.g., $C_{6-10}$-aryl) substituted amino. Suitable substituents of said substituted groups including said substituted $R_5$-$R_7$ groups comprise, for example, halogen, alkyl such as alkyl having 1 to about 16 carbon atoms, more preferably 1 to about 6 carbon atoms, and heteroalkyl including alkoxy such as alkoxy having one or more oxygen linkages and from 1 to about 10 carbon atoms, more preferably 1 to about 6 carbon atoms.

Specifically preferred organometallic reagents for the organometallo-incorporation step include dimethylsilyldiethylamine, dimethylsilyldimethylamine, trimethylsilyldimethylamine, tetramethyldisilazane, trimethylsilylimidazaole and hexamethyldisilazane.

Generally a relatively thin layer 60 of organometallic material is formed on unexposed regions 40, e.g., a layer of about $\leq 5000$ Angstroms in thickness, more typically a layer of about $\leq 2500$ Angstroms in thickness. The remaining thickness of the resist film remains essentially unreacted. Further incorporation of an organometallic material can be made if desired, for example penetration of the organometallic reagent to a depth of up to about 10,000 Angstroms or greater, although such additional treatment is generally not necessary for imparting good plasma etch resistance to the resist coating.

In Step 5 of the method depicted in FIG. 1, resist coating 20 that is selectively enriched with organometallic material(s) is developed. Dry development with virtually any plasma that attacks organic material is preferred. Plasmas based on oxygen attack organic films such as photoresist films are more preferred for purposes of this invention. A preferred means for dry development involves the use of an oxygen containing reactive ion etch to achieve anisotropic development by procedures known in the art. Dry development is continued until all the extraneous photoresist is removed from exposed areas 30 of resist coating 20.

Additionally, rather than a purely dry development, a partial wet development followed by dry development may be employed as disclosed in U.S. Pat. No. 5,108,875 to Thackeray, et al.

Following development, relief image 70 can be removed with a suitable stripper solution as is known in the art, for example a relatively concentrated (e.g., 20 weight percent) aqueous sodium hydroxide solution. Typically however, after formation of relief image 70, the substrate bared by dry development will be altered as desired. Alteration may include etching, metal deposition, doping, etc. Etching is a common method of altering the substrate in semiconductor device manufacture. For example, a plasma can be used for etching a semiconductor substrate and plasmas containing fluorine atoms, such as may be formed from $CF_4$, $SF_6$ or $NF_3$ may be used for etching silicon, silicon oxide or silicon nitride. Further, plasma etching of the substrate may immediately follow plasma development with removal of the substrate from the plasma etching chamber.

Details of plasma development and plasma etching are described in the literature such as in Boenig, H. V., *Plasma Science and Technology*, Cornell Univ. Press, Ithaca, N.Y. (1982); Mucha, J. A., et al., *Introduction of Microlithography*, American Chem. Society (1983); and Kalter, H., et al., Plasma Etching in IC Technology, *Philips. Tech Rev.*, 38, No. 7/8, 200–210 (1978–79).

Follow alteration of the underlying substrate bared by development, relief image 70, if not previously removed, may be stripped with a conventional remover for the photoresist, e.g., an aqueous alkaline solution as mentioned above.

Figure 2:
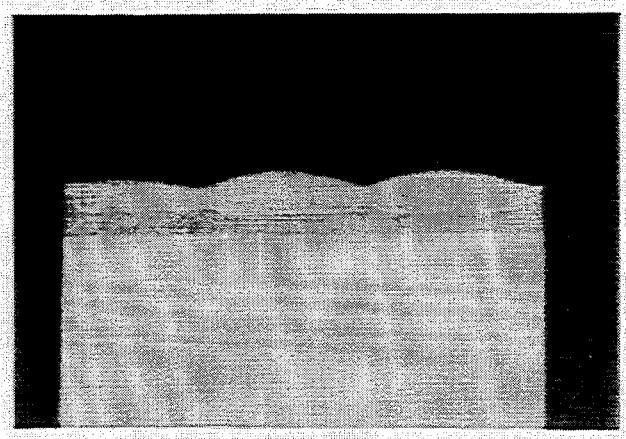
FIG. 2 is a SEM of a photoresist coating that has been treated with an organometallic material without prior formation of a crosslinked surface layer or a prior partial development.

In FIG. 2 of the Drawings a scanning electron microscope micrograph (SEM) is shown of an acid-hardening photoresist coating where an organosilane had been incorporated into the coating by vapor phase application, but where a crosslinked surface layer had not been formed in the resist coating prior to the organosilane incorporation reaction. Swelling and lateral expansion of the unexposed of the coating layer regions can be observed in FIG. 2.

Figure 3:
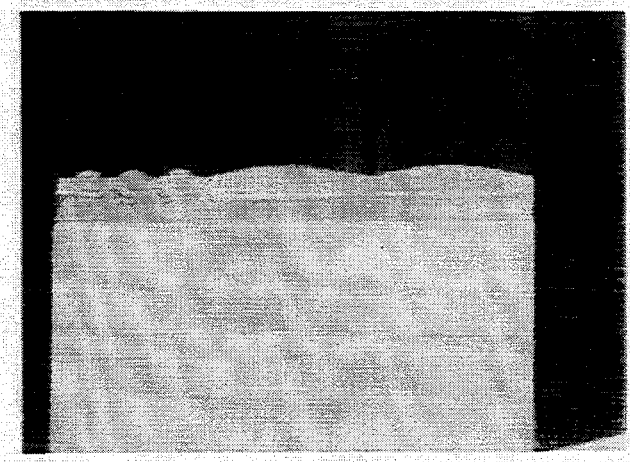
FIG. 3 is a SEM of a photoresist coating in which a crosslinked surface layer had been formed and subsequently treated with an organometallic material.

The results depicted in FIG. 2 contrast with the results shown in FIG. 3. FIG. 3 is a SEM of an acid-hardening photoresist coating where an organosilane had been incorporated into the coating by vapor phase application, but where a crosslinked surface layer had been formed in the resist coating prior to the organosilane incorporation reaction. As can be seen in FIG. 3, essentially no lateral expansion of silylated material resulted from the organosilane incorporation.

In an embodiment of the invention alternative to the method depicted in FIG. 1, a photoacid-generating composition, particularly an acid-hardening photoresist as described above, is preferably used and the order of steps of the method described above and depicted in FIG. 1 is changed. Specifically, formation of crosslinked layer 50 (Step 3 of FIG. 1) and treatment of the photoresist coating 20 with organometallic material (generally, Step 4 of FIG. 1) is carried out prior to exposing coating 20 to patterned activating radiation (Step 2 in FIG. 1). In this embodiment, organometallic material deposits across the full surface area of coating 20. Subsequent exposure to activating radiation results in the release of photogenerated acid in exposed areas which results in removal of metal from exposed areas. More specifically, in the case of application of an organosilane, photogenerated acid desilylates exposed areas of the photoresist film. The silyl hydrolysis products then can be at least substantially removed during a post-exposure bake or wet development as described above. See U.S. Pat. Nos. 5,108,875 and 4,921,778.

Another aspect of the invention provides methods comprising partially developing a photoresist coating layer prior to incorporation of organometallic material on the resist coating. As mentioned above, due to volume expansion resulting from incorporation of organometallic material, photoresist and organometallic material can flow laterally, reducing resolution of a patterned image. More specifically, upon application of organometallic material to an exposed photoresist coating, the unexposed areas may expand into exposed regions of the coating layer.

It has been found that by partially developing an exposed resist coating to partially remove unexposed regions, "refilling" of the developed depressions in the resist coating with organometallic material results in essentially no expansion or swelling of the unexposed regions. Further, it now has been found that such partial development results in increased penetration into small (i.e. 0.5–1.0 μm) features relative to where such small features had not been partially developed prior to application of organometallic material. It has been observed that shallower penetration of organometallic material occurs in small features relative to penetration into comparatively larger features. See Hartney, M. A., et al., *Microlithography World*, 1: 16 (1992).

The partial development preferably results in removal of a volume of photoresist that is at least a substantial fraction of the organometallic material that is to be incorporated into the resist coating. Specifically, it has been found suitable to remove by development a volume of photoresist equal to approximately two-thirds the volume of the organometallic material subsequently incorporated into the resist coating. An etch resistant effective amount of organometallic material should be incorporated into a resist coating, as discussed above.

The partial development is preferably performed by application of a developer solution to a resist coating, although other development means also will be suitable. For an alkaline aqueous developable photoresist, application of a moderately basic aqueous solution is suitable such as a tetramethylammonium hydroxide aqueous solution or a metal hydroxide (e.g., sodium or potassium hydroxide) aqueous solution having a normality of from about 0.1 to 0.6. The resist coating is exposed to the developer solution for a time sufficient to remove a suitable amount of resist coating as discussed above. Thus suitable periods for exposure to a developer solution will vary with the strength of the developer, e.g., for several seconds to several minutes.

For this aspect of the invention which comprises partial development of a resist coating prior to incorporation of organometallic material into those partially developed areas of the coating, the organometallic material applied and conditions for application are suitably the same as described above in connection the method depicted in FIG. 1, specifically the organometallic materials and conditions described with respect to Step 4 of FIG. 1. In the case of a negative-acting crosslinking resist, organometallic incorporation occurs selectively into unexposed regions of the resist coating only, and substantially or essentially no organometallic material is incorporated into exposed regions. A crosslinked layer 50 may be formed (Step 3 of FIG. 1) after partial development and prior to organometallic application, but also may be omitted if desired in this aspect of the invention. Preferred photoresists for this partial development process include acid-hardening photoresists such as those described above.

All documents mentioned herein are incorporated herein by reference.

The following non-limiting examples are illustrative of the invention.

GENERAL COMMENTS

In the examples, exposures of photoresist coatings are made on a GCA ALS200 KrF excimer laser stepper (248 nm, NA=0.35). Post exposure bakes are done by placing resist coated wafers on a hotplate. Gas phase treatments with organosilyl materials are accomplished with a Genesis Microstar 200 system. All organosilyl materials are obtained from commercial sources and used without further purification.

EXAMPLE 1

A negative-tone acid-hardening photoresist composition sold under the tradename SNR 248 sold by the Shipley Co. (Newton, Mass.) is spin coated to a wet thickness of 1.8 μm on a silicon wafer. The wafer is then baked on a hotplate for 60 seconds at 100° C. to remove solvent. The resist coating layer is then exposed to activating radiation through a patterned photomask at an exposure dose of 400 mJ/cm$^2$. The exposed wafer is then post-exposure baked at 100° C. for 60 seconds. The wafer is then placed in a vacuum oven and heated to 90° C. Vapors of bis(dimethylamino)dimethylsilane are then admitted to the oven at a pressure of 120 torr. Sixty seconds after introducing the organosilane reagent, the oven is evacuated. After evacuation of the oven, vapors of (dimethylsilyl)dimethylamine are admitted to the oven at a pressure of 50 torr with the oven temperature maintained at 90° C. Seventy-five seconds after introducing this organosilane reagent, the oven is evacuated. The wafer is then removed from the oven and a cross-section thereof subjected to a brief oxygen plasma to develop the coating layer and define the silylated regions.

EXAMPLE 2

A negative-tone acid-hardening photoresist composition sold under the tradename SAL 601 sold by the Shipley Co. is spin coated to a wet thickness of 1.8 μm on a silicon wafer. The wafer is then baked on a hotplate for 60 seconds at 100° C. to remove solvent. The resist coating layer is then exposed to activating radiation through a patterned photomask at an exposure dose of 20 mJ/cm$^2$. The exposed wafer is then post-exposure baked at 100° C. for 60 seconds. The wafer is then placed in a vacuum oven and heated to 110° C. Vapors of bis(dimethylamino)dimethylsilane are then admitted to the oven at a pressure of 40 torr. Sixty seconds after introducing this organosilane reagent, the oven is evacuated and the wafer removed therefrom. The wafer is then placed in a vacuum oven and heated to 100° C. After heating, vapors of (trimethylsilyl)dimethylamine are admitted to the oven at a pressure of 80 torr. Three hundred seconds after introducing this silane reagent, the oven is evacuated. The wafer is then removed from the oven and a cross-section thereof subjected to a brief oxygen plasma to develop the coating layer and define the silylated regions.

EXAMPLE 3

Figure 4A:
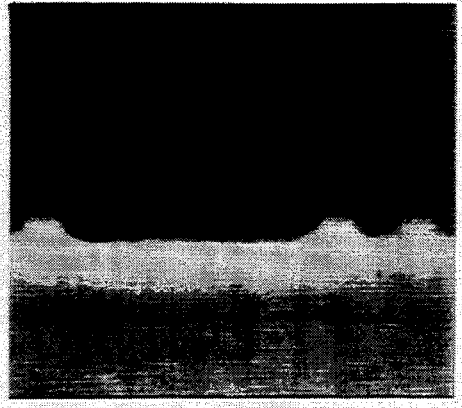
FIGS. 4A, 4B and 4C are SEMs showing a photoresist coating after preliminary development treatment (FIG. 4A), the same photoresist coating after subsequent incorporation of organometallic material (FIG. 4B), and the same photoresist coating after plasma etching (FIG. 4C).
Figure 4B:
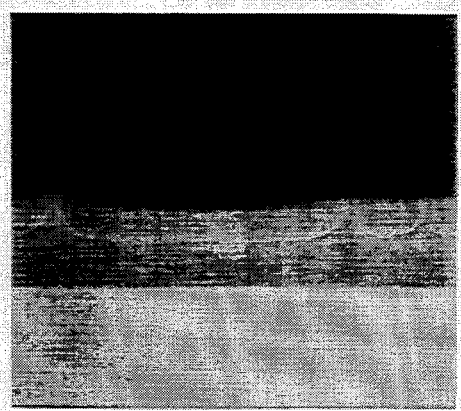
Figure 4C:

A negative-tone acid-hardening photoresist composition sold under the tradename SAL 601 by the Shipley Co. is spin coated onto a silicon wafer and the resist solvent thermally removed. The resist coating is then exposed to activating radiation through a patterned photomask at an exposure dose of about 40 mJ/cm$^2$. After post-exposure bake, the exposed resist coating is partially wet developed by treating the coating for 40 seconds with a 0.23N tetramethylammoniumhydroxide aqueous solution resulting in the removal of a thickness of approximately 4,000 Angstroms of resist from unexposed regions of the coating layer. FIG. 4A shows a SEM for 5 μm and 1 μm features with 0.5 μm spacing after this partial development. The partially developed coating layer is treated with vapors of (dimethylsilyl)-dimethylamine to selectively "re-fill" the partially developed unexposed regions of the coating layer. FIG. 4B is an SEM of the coating layer after this silylation showing that the depth of Si is virtually identical for both features sizes (i.e., 5 $\mu$m and 1 $\mu$m) and essentially no overflow in the 0.5 $\mu$m gaps between the regions of Si incorporation. FIG. 4C shows the coating layer after dry etching to provide a highly resolved relief image having an etch resistant layer of organometallic material incorporated therein.

This invention has been described in detail with reference to preferred embodiments thereof. However, it will be appreciated that those skilled in the art, upon consideration of the present disclosure, may make modifications and/or improvements within the scope and spirit of the invention as set forth in the following claims.

What is claimed is:

1. A method of dry developing a photoresist coating using an organometallic material comprising:

(a) applying a coating of a negative-acting photoresist composition on a substrate;
   (b) exposing the photoresist to patterned activating radiation to crosslink the photoresist coating where exposed;
   (c) partially developing the photoresist coating to form depressions in the photoresist coating by removal of a portion only of unexposed areas of the photoresist coating;
   (d) filling the depressions within the partially developed photoresist coating with organometallic material; and
   (e) dry developing the photoresist coating to provide a relief image comprising organometallic material overlying the unexposed portions of the photoresist coating.

2. The method of claim 1 where photoresist coating is partially developed with a developer solution.

3. The method of claim 1 where areas of the photoresist coating that are not partially developed are essentially free of organometallic material after treatment of the photoresist coating with the same.

* * * * *